DIFFUSED COLLECTOR TRANSISTOR

Filed Aug. 3, 1962

INVENTORS
JOSEPH G. F. BOUCHARD
& LEE A. HERMANSEN

BY Connolly and Hutz

ATTORNEYS

United States Patent Office 3,265,943

Patented August 9, 1966

3,265,943

DIFFUSED COLLECTOR TRANSISTOR

Joseph G. F. Bouchard, Manchester, and Lee A. Hermansen, Concord, N.H., assignors to Sprague Electric Company, North Adams, Mass., a corporation of Massachusetts Filed Aug. 3, 1962, Ser. No. 214,612
1 Claim. (Cl. 317—235)

This invention relates to a transistor and to the method of making the same, and more particularly to a high power transistor with high frequency performance.

There are two presently known types of transistors that have gained recognition in the art for outstanding manufacturing and performance characteristics. One of these transistors is the so-called electrochemical transistor which provides outstanding circuit performance due to low saturation voltage, as well as low storage time and high cut-off frequency due to the narrow base width. This type of transistor is produced by electrolytically etching and subsequently plating emitter and collector electrodes upon a suitable base material. By the virtue of the highly developed electrochemical process, a close control on base thickness and electrode size is maintained. As a result, production transistors are remarkably uniform, and the process lends itself to automation with its ultimate minimum cost. The other well recognized transistor is the so-called Mesa transistor which has superior power handling capabilities due to a low thermal resistance mounting, and a more uniform collector junction due to diffusion.

It is an object of this invention to provide a transistor having the outstanding characteristics of both the electrochemical transistor and the Mesa transistor.

Another object of this invention is to provide a high-voltage, high-current, high-power transistor that is produced by a highly automated process.

These and other objects of this invention will become apparent upon consideration of the following description and claim in conjunction with the accompanying drawing, in which:

Figures 1, 2:
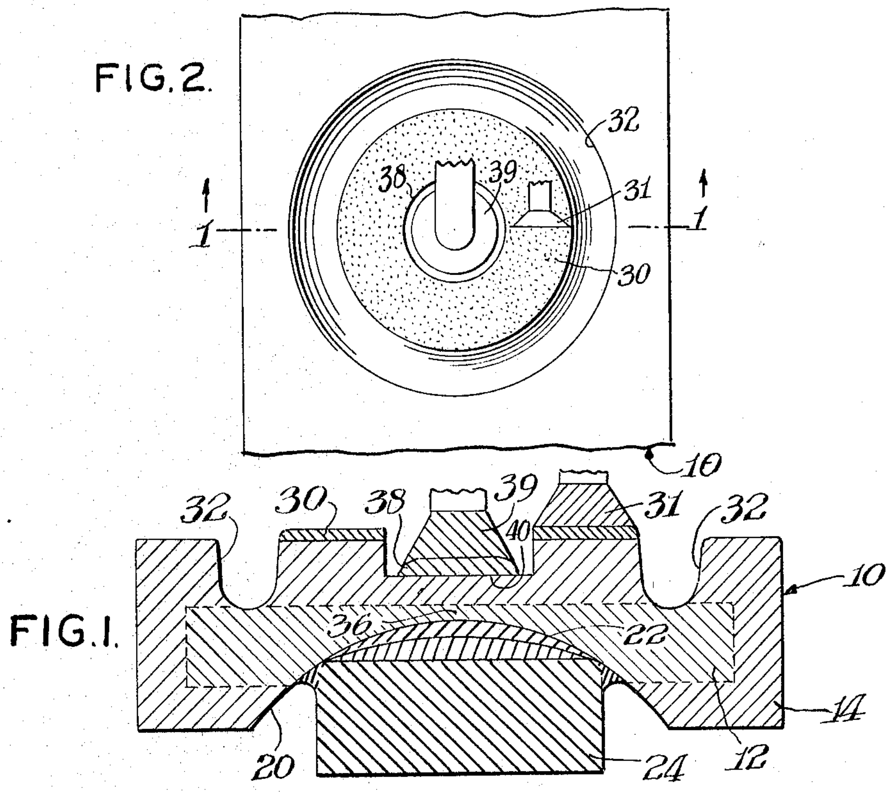
FIGURE 1 is a cross-section of the preferred embodiment of a transistor constructed according to this invention.
FIGURE 2 is a plan view of the structure shown in FIGURE 1.
Figure 3:
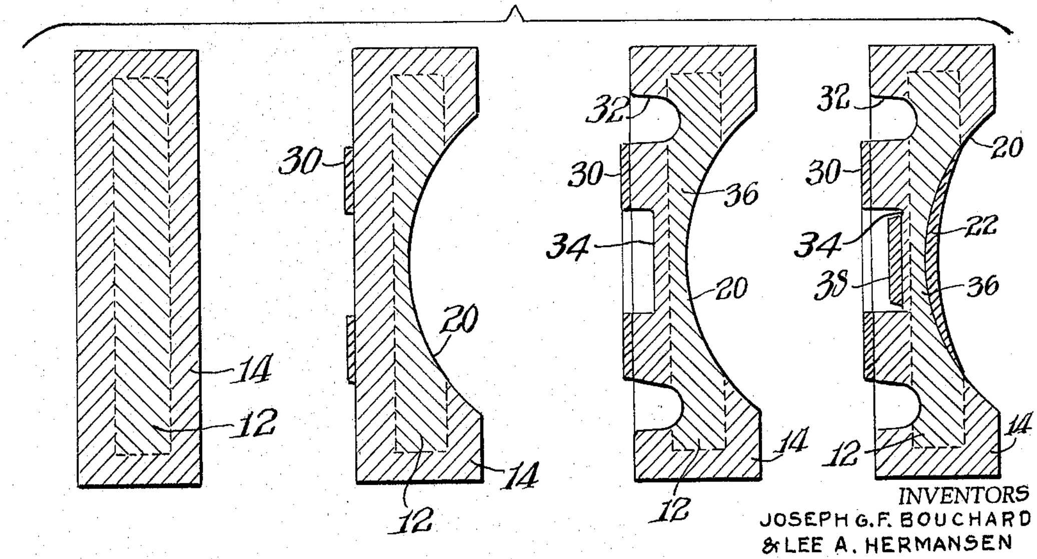
FIGURE 3 is a series of diagrammatic cross-sections of steps in the method of constructing the transistor of this invention.

The objects of this invention are attained by a transistor utilizing the narrow base width and the micro-alloying and mechanization of the electrochemical transistor along with the diffused junction and low thermal resistance of the Mesa transistor. The transistor of this invention incorporates the oustanding characteristics of the electrochemical transistor and the Mesa transistor to provide a transistor having the high frequency of an electrochemical transistor and the power handling capability of a Mesa transistor.

The process for producing the transistor 10 that forms the preferred embodiment of this invention begins with the cutting of a die or blank 12 of suitable semiconductor material. For the purpose of this description the transistor will be described in terms of p-type germanium. However, it will be understood to be within the scope of this invention to utilize other semiconductive materials, for example, silicon and the intermetallic compounds such as gallium-arsenide.

An n-type dopant 14 is diffused into the p-type blank. Arsenic is a suitable n-type dopant, although antimony and phosphorous could be employed. The diffusion is the usual open-tube diffusion using hydrogen as the carrier gas and arsenic as the dopant. This operation is known to the art in the fabrication of electrochemical diffused-base transistors.

The blank 12 is then mounted on a tab and carrier assembly for processing in the automated equipment that is known to the electrochemical transistor art. The collector etch pit 20 is then etched to provide a web thickness of from about 0.35 to about 0.45 mil. Thickness control of this web, which is the base of the transistor, is achieved by monitoring the transmission of infrared through the germanium, or by mechanical control in a two-step rough and finish etch system.

A ring 30 is then electroplated onto the emitter side of the blank from an acid bath. In the preferred embodiment, ring 30 is of gold; however, other metals which are not attacked by the etch, such as cadmium, tin, and zinc may be employed. The ring contact provides uniform closeness to the active base region at the emitter. The gold ring becomes the base contact and provides a very low extrinsic base resistance. The ring 30 is plated by using a jet which rotates about a fixed center. Adjustment of the ratio of the length of the arm above and below the pivot point of the jet, and variation of the radius of the jet permit a high degree of adjustability to be achieved in the electroplating of the ring. The width of the ring can be further varied over narrow limits by varying the plating current.

A moat 32 is etched around gold ring 30, by employing a conventional etching solution, e.g. hydrofluoric acid, hydrochloric acid, etc. in water, biasing the jet positive and the blank negative. This moat 32 delineates the collector junction by extending through the diffused n-type layer 14 into the p-type body 12. By utilizing the jet etch of this invention the junction is cut without the use of complex prior art procedures including masks.

The emitter breakdown voltage is determined by etching an emitter pit 34 within gold ring 30. This emitter etch pit 34 is about 0.15 to about 0.25 mil deep, thereby leaving a base thickness 36 between the emitter and the collector of from about 0.20 to about 0.26 mil.

The emitter and collector contacts 38 and 22, respectively, are then plated, using a cadmium base solution for the emitter and gold for the collector. The emitter contact 38 is a junction contact, whereas the collector contact 22 is an ohmic contact.

The emitter lead 39 is attached to the emitter contact 38 and the contact is micro-alloyed to provide a micro-alloy junction 40. The emitter junction 40 and the lead 39 may be formed simultaneously by using micro-alloying techniques known to the electrochemical transistor art with an electroplated cadmium-tin-zinc-gallium solder.

The base lead 31 is attached to the gold ring 30 by an electroplated tin-cadmium solder; other suitable materials include Sn–In, Sn–Pb, Pb–As. It is to be noted that no alloying of the base contact is utilized.

The collector attachment is made by a mounting member 24 which provides a high thermal conductance path to the mounting case, thereby permitting increased power dissipation. When using a stud as the mounting member, the contact between the stud and the collector is made massive by employing a considerable quantity of solder to provide the dual function of mechanical strength and heat conduction. Alternatively, the pit may be filled by electroplating, evaporation, etc. In the preferred embodiment shown in the drawing, member 24 is a massive silver disc which is soldered to collector plating 22.

At this stage in the process the transistor 10 is electrically complete and is detached from the tab and carrier. A suitable mounting for the preferred embodiment of this invention comprises securing member 24 to a conventional header with electrodes welded to the respective leads. The unit may be completed by a vacuum baking and hermetic sealing by welding a cap to the header.

The preferred embodiment of this invention produced by the above-described process meets the requirements of a high speed saturating switch, and high efficiency power amplifier oscillator, and yet provides low junction-to-case thermal resistance. The transistor of this invention has utility in any of the many known transistor applications. Notable applications for this transistor includes switching, wherein the narrow mechanical base width maintains a high transfer frequency and high switching speeds over a wide range of current. Other applications are amplifiers and oscillators, capable of operating in the VHF and UHF range and provide substantial power with high efficiencies. The excellent thermal and electrical properties of this constructioin permit the fabrication of much higher power devices with very high frequency performance.

It will be understood that the above-described embodiment of this invention is for purpose of illustration only, and that modifications may be made without departure from the spirit of the invention. It is intended that this invention be limited only by the scope of the appended claim.

We claim:

A transistor comprising a body of semiconductor material having oppositely disposed pits defining a narrow web therebetween, said narrow web containing a diffused collector junction, an alloyed emitter junction in the pit on one side of said web, a massive ohmic collector in the pit on the other side of said web, a moat determining the extent of said collector by extending through said diffused collector junction from said emitter side, and a ring-shaped base contact encircling said emitter within said moat.

References Cited by the Examiner

UNITED STATES PATENTS

| | | | |
|---|---|---|---|
| 2,947,925 | 8/1960 | Maynard et al. ------ | 317—234 |
| 3,005,132 | 10/1961 | Pankove ----------- | 317—235 |
| 3.038,087 | 6/1962 | Luscher ------------ | 317—235 |
| 3,087,099 | 4/1963 | Lehovec ----------- | 317—235 |

JOHN W. HUCKERT, *Primary Examiner.*

GEORGE WESTBY, *Examiner.*

L. ZALMAN, *Assistant Examiner.*